(12) United States Patent
Bhandarkar et al.

(10) Patent No.: US 9,490,690 B2
(45) Date of Patent: Nov. 8, 2016

(54) FILTER CAPACITOR DEGRADATION IDENTIFICATION USING COMPUTED POWER

(71) Applicants: Santosh Manjunath Bhandarkar, Cedarburg, WI (US); Sinuhe Imuris Benitez Escobar, Mequon, WI (US)

(72) Inventors: Santosh Manjunath Bhandarkar, Cedarburg, WI (US); Sinuhe Imuris Benitez Escobar, Mequon, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 99 days.

(21) Appl. No.: 14/204,317

(22) Filed: Mar. 11, 2014

(65) Prior Publication Data

US 2015/0263600 A1    Sep. 17, 2015

(51) Int. Cl.
*H02M 1/12*    (2006.01)
*G01R 31/02*    (2006.01)
*H02M 5/458*    (2006.01)
*H02M 7/219*    (2006.01)
*G01R 31/42*    (2006.01)

(52) U.S. Cl.
CPC ............ *H02M 1/126* (2013.01); *G01R 31/028* (2013.01); *H02M 5/4585* (2013.01); *H02M 7/219* (2013.01); *G01R 31/42* (2013.01)

(58) Field of Classification Search
CPC ... H02M 1/126; H02M 5/4585; H02M 7/219
USPC .............................................. 363/37, 39, 44
See application file for complete search history.

(56) References Cited

U.S. PATENT DOCUMENTS

| | | |
|---|---|---|
| 4,419,621 A | 12/1983 | Becker |
| 4,721,916 A | 1/1988 | Hanasawa |
| 5,319,513 A | 6/1994 | Lowenstein et al. |
| 5,491,725 A | 2/1996 | White |
| 5,796,258 A | 8/1998 | Yang |

(Continued)

FOREIGN PATENT DOCUMENTS

| | | |
|---|---|---|
| CN | 201393056 Y | 1/2010 |
| EP | 2299568 A1 | 3/2011 |

(Continued)

OTHER PUBLICATIONS

Extended European Search Report, EP Appl. No. 15158540.3, mailed Jul. 29, 2015, completed Jul. 20, 2015, Munich, DE, 7 pgs.

(Continued)

*Primary Examiner* — Jue Zhang
*Assistant Examiner* — Kyle J Moody
(74) *Attorney, Agent, or Firm* — Fay Sharpe LLP (57) ABSTRACT

Methods and apparatus are presented for detecting filter capacitor degradation in a power converter in which filter circuit branch currents and voltages are concurrently measured, nominal and measured power values are automatically computed according to the measured voltages, the operating frequency and nominal capacitance values, and power change values are calculated based on the difference between the measured and calculated nominal power values, and the change values are evaluated to selectively identify filter capacitor degradation conditions in the filter circuit.

21 Claims, 5 Drawing Sheets

(56) References Cited

U.S. PATENT DOCUMENTS

| | | | |
|---|---|---|---|
| 5,804,973 | A | 9/1998 | Shinohara |
| 6,166,929 | A | 12/2000 | Ma et al. |
| 6,269,010 | B1 | 7/2001 | Ma et al. |
| 6,366,483 | B1 | 4/2002 | Ma et al. |
| 6,525,951 | B1 | 2/2003 | Paice |
| 6,642,689 | B2 | 11/2003 | Ishida et al. |
| 6,667,866 | B1 | 12/2003 | LaPlace |
| 7,274,576 | B1 | 9/2007 | Zargari et al. |
| 7,309,973 | B2 | 12/2007 | Garza |
| 7,495,410 | B2 | 2/2009 | Zargari et al. |
| 7,495,938 | B2 | 2/2009 | Wu et al. |
| 7,511,976 | B2 | 3/2009 | Zargari et al. |
| 7,602,127 | B2 | 10/2009 | Coumou |
| 7,616,005 | B2 | 11/2009 | Kalyuzhny et al. |
| 7,683,568 | B2 | 3/2010 | Pande et al. |
| 7,764,523 | B2 | 7/2010 | Conticelli et al. |
| 7,782,009 | B2 | 8/2010 | Wiseman |
| 7,786,735 | B2 | 8/2010 | Kalyuzhny et al. |
| 7,800,348 | B2 | 9/2010 | Zargari |
| 7,812,615 | B2 | 10/2010 | Gajic et al. |
| 7,818,137 | B2 | 10/2010 | Agarwal |
| 7,990,097 | B2 | 8/2011 | Cheng et al. |
| 8,009,450 | B2 | 8/2011 | Royak et al. |
| 8,030,791 | B2 | 10/2011 | Lang et al. |
| 8,044,631 | B2 | 10/2011 | Dai et al. |
| 8,259,426 | B2 | 9/2012 | Xiao et al. |
| 8,259,480 | B2 | 9/2012 | Hasler |
| 8,350,397 | B2 | 1/2013 | Lang et al. |
| 8,352,203 | B2 | 1/2013 | Seibel et al. |
| 8,395,910 | B2 | 3/2013 | Alexander |
| 8,400,800 | B2 | 3/2013 | Alexander |
| 8,587,160 | B2 | 11/2013 | Dai et al. |
| 8,643,383 | B2 | 2/2014 | Xiao |
| 8,648,610 | B2 | 2/2014 | Mikami |
| 8,698,507 | B2 | 4/2014 | Huang |
| 8,729,844 | B2 | 5/2014 | Feng et al. |
| 2001/0017489 | A1 | 8/2001 | Inoue et al. |
| 2004/0257093 | A1 | 12/2004 | Sakiyama |
| 2009/0072982 | A1 | 3/2009 | Cheng et al. |
| 2010/0161259 | A1 | 6/2010 | Kim et al. |
| 2010/0321038 | A1* | 12/2010 | Dommaschk ......... H02M 7/483 324/658 |
| 2011/0292696 | A1* | 12/2011 | Xiao ....................... H02M 1/32 363/37 |
| 2012/0271572 | A1 | 10/2012 | Xiao |
| 2013/0057297 | A1 | 3/2013 | Cheng |
| 2013/0076151 | A1 | 3/2013 | Bae et al. |
| 2013/0120038 | A1 | 5/2013 | Kerkman et al. |
| 2013/0120039 | A1 | 5/2013 | Kerkman et al. |
| 2013/0279214 | A1 | 10/2013 | Takase et al. |
| 2013/0286692 | A1* | 10/2013 | Patel ....................... H02M 1/32 363/37 |
| 2014/0012552 | A1 | 1/2014 | Zik |
| 2014/0217980 | A1* | 8/2014 | Malrieu ............... B60L 11/1811 320/109 |
| 2014/0320056 | A1* | 10/2014 | Royak .................. H02M 1/126 318/504 |
| 2015/0092460 | A1* | 4/2015 | Tallam .................. H02M 7/125 363/44 |
| 2015/0155794 | A1* | 6/2015 | Long ..................... H02M 7/062 363/53 |
| 2015/0241503 | A1* | 8/2015 | Bhandarkar ......... G01R 31/028 363/44 |

FOREIGN PATENT DOCUMENTS

| | | |
|---|---|---|
| EP | 2 390 997 A2 | 11/2011 |
| EP | 2660962 A2 | 11/2013 |
| FR | 2980053 | 3/2011 |
| WO | WO2012010353 A1 | 1/2012 |
| WO | WO2012044737 A1 | 4/2012 |
| WO | WO2012110087 | 8/2012 |
| WO | WO2012110088 A1 | 8/2012 |
| WO | WO 2013/038098 | 3/2013 |

OTHER PUBLICATIONS

European Search Report completed Jul. 20, 2015 for Application No. EP 15 15 6270.
Rodriguez-Valdez, et al., "Phase Locked Loop for Unbalanced Utility Conditions", 2010 Applied Power Electronics Conference and Exposition (APEC), 2010 $25^{th}$ Annual IEEE 2010, Piscataway, NJ, Feb. 21, 2010, pp. 634-641.
ABB Bay Control REC670 Application manual, Relion 670 series, http://www05./abb.com/global/scot/scot354.nsf, Oct. 10, 2011, pp. 1-586 (2 parts).
Transformer protection RET670 ANSI Application manual, Relion 670 series, http://www.abb.com/product/db0003db004281/c12573e700330419c/257f000263ad5.aspx#!, May 6, 2011, pp. 1-864 (2 parts).
"Protective Relays", iCP-630 Capacitor Bank Protection Relay, Cooper Power Systems, Jan. 2011, pp. 1-8.
ABB Distribution Automation Handbook, Section 8.10 Protection of Capacitor Banks, Mar. 5, 2011.
GE C70 Capacitor Bank Protection and Control System UR Series Instruction Manual C70 Revision: 6.0x, Copyright @ 2011, GE Multilin, http://www.GEmultilin.com, pp. 1-644 (2 parts).
"iCP-630 Capacitor Bank Protection Relay", Cooper Power Systems, Mar. 2007.
U.S. Appl. No. 13/570,781, "Filter Capacitor Degradation Detection Apparatus and Method", by Patel et al., filed Aug. 9, 2012.
U.S. Appl. No. 13/872,177, "Active Front End Filter Capacitor Failure Prediction With Y and Delta Capacitor Connection", by Royak et al., filed Apr. 29, 2013.
U.S. Appl. No. 14/042,753, "Method and Apparatus for Detecting AFE Filter Capacitor Degradation", by Tallam et al., filed Oct. 1, 2013.
U.S. Appl. No. 14/095,169, "Impedance Detector Apparatus and Method", by Kerkman et al., filed Dec. 3, 2013.
U.S. Appl. No. 14/187,972, "Filter Capacitor Degradation Identification Using Computed Current", by Bhandarker et al., filed Feb. 24, 2014.
Bhattacharya, "Basic Electrical and Electronics Engineering", Aug. 18, 2011, 10 pgs.
Lee, et al., "Online capacitance estimation of DC-link electrolytic capacitors for three-phase AC/DC/AC PWM converters using recursive least squares method", IEE Proc.-Electr, Power Appl., vol. 152, No. 6, Nov. 2005.

* cited by examiner

FILTER CAPACITOR DEGRADATION IDENTIFICATION USING COMPUTED POWER

BACKGROUND INFORMATION

The disclosed subject matter relates to power conversion, and more specifically to apparatus and techniques for detecting degraded filter circuit capacitors.

BRIEF DESCRIPTION

Various aspects of the present disclosure are now summarized to facilitate a basic understanding of the disclosure, wherein this summary is not an extensive overview of the disclosure, and is intended neither to identify certain elements of the disclosure, nor to delineate the scope thereof. The primary purpose of this summary is instead to present various concepts of the disclosure in a simplified form prior to the more detailed description that is presented hereinafter.

In one embodiment, a method is provided for detecting filter circuit capacitor degradation, which includes measuring filter circuit branch currents and voltages, as well as computing nominal filter circuit power values at least partially according to the measured filter circuit voltages, a filter operating frequency and at least one nominal capacitance value. The method further includes computing measured filter circuit power values using the measured filter circuit voltages and the measured filter circuit branch currents. In addition, power change values are computed which represent deviations of the corresponding measured and nominal power values, and capacitor degradation conditions are selectively identified at least partially according to the power change values.

In one embodiment, a non-transitory computer readable medium is disclosed, having computer-executable instructions for computing nominal filter circuit power values using measured filter circuit voltages, a filter operating frequency, and at least one nominal capacitance value, as well as for computing measured filter circuit power values using measured filter circuit voltages and filter circuit branch currents. Computer-executable instructions are also provided for computing power change values representing deviations of individual measured filter circuit power values from the corresponding nominal filter circuit power values, and selectively identifying a filter capacitor degradation condition at least partially according to the power change values.

In one embodiment, a power converter is disclosed, including a filter circuit, a measurement circuit configured to measure branch currents and voltages associated with the filter circuit, and at least one processor programmed to compute nominal filter circuit power values using the measured filter circuit voltages, a filter operating frequency and at least one nominal capacitance value, to compute measured filter circuit power values using measured filter circuit voltages and filter circuit branch currents, and to compute power change values representing deviations of individual measured power values from the corresponding nominal power values, as well as to selectively identify a filter capacitor degradation condition at least partially according to the power change values.

BRIEF DESCRIPTION OF THE DRAWINGS

The following description and drawings set forth certain illustrative implementations of the disclosure in detail, which are indicative of one or more exemplary ways in which the various principles of the disclosure may be carried out. The illustrated examples, however, are not exhaustive of the many possible embodiments of the disclosure. Other objects, advantages and novel features of the disclosure will be set forth in the following detailed description when considered in conjunction with the drawings, in which.

DETAILED DESCRIPTION

Referring now to the figures, one or more embodiments or implementations are hereinafter described in conjunction with the drawings, wherein the various features are not necessarily drawn to scale. Motor drives and other power converters operate using power from AC power sources, and an input filter circuit may be provided between the AC source and an input rectifier in order to reduce switching noise associated with operation of the power converter. For example, filter circuits are often provided to control total harmonic distortion (THD) generated by high frequency operation of active front end (AFE) rectifiers. Input filter circuits may be of a variety of topologies, such as inductance-capacitance (L-C) or inductance-capacitance-inductance (L-C-L) input filter circuitry associated with each AC input phase to control the harmonic content of a connected power grid. The capacitors in such filter circuits, however, may be subject to damage or degradation, which can be costly in terms of replacement component costs, labor for inspection and replacement, as well as downtime for the power converter and any associated machinery to manually identify one or more degraded capacitors. Moreover, capacitor degradation may not be identifiable through simple visual inspection by service personnel. Fuses may be placed in line with the filter circuit capacitors, but the fuses may not open quickly enough to prevent capacitor degradation or may open frequently in normal operation with healthy capacitors, leading to excessive system downtime and further costs for inspection and system verification.

The present disclosure provides filter capacitor degradation identification solutions that may be and advantageously employed in connection with active front end motor drives and other power converters, as well as in other filter circuit applications. Method and apparatus embodiments are disclosed for filter capacitor degradation detection in which filter circuit branch currents and voltages are measured, and nominal and measured power values are computed according to the measured currents and voltages, a circuit operating frequency and one or more nominal capacitance values. Power change values are calculated based on the difference between the measured and nominal computed power values, and the power change values are evaluated to facilitate selective identification or detection of filter capacitor degradation conditions in the filter circuit. The disclosed concepts thus represent a significant advance over prior approaches since no fuses are used and the onset of degradation can be assessed prior to system damage in an automated, substantially real time fashion. The detected degradation condition can be used, in turn, to provide a system alert or warning and/or to shut down the power converter in certain non-limiting applications.

The disclosed concepts find utility in association with active front end motor drives as well as other forms of power converters. In addition, although illustrated in the context of three-phase input devices, the disclosed concepts can be employed in power converters having any number of input phases in which a filter includes a capacitor circuit or capacitor bank with capacitor components subject to degradation. The disclosed techniques and apparatus advantageously facilitate identification of potential degradation of the individual filter capacitors, and a determination can be made as to whether one or more of these components are degrading in certain embodiments. The degradation detection, moreover, can be used to initiate any appropriate remedial or reporting action. In this manner, the present disclosure avoids the over inclusive or under inclusive nature of protective fuse-based solutions, and also advantageously facilitates early identification of the onset of component degradation filter capacitors. This, in turn, can facilitate reduction in system downtime and reduce or mitigate maintenance costs associated with operation of a motor drive or other power converter.

Figure 1:
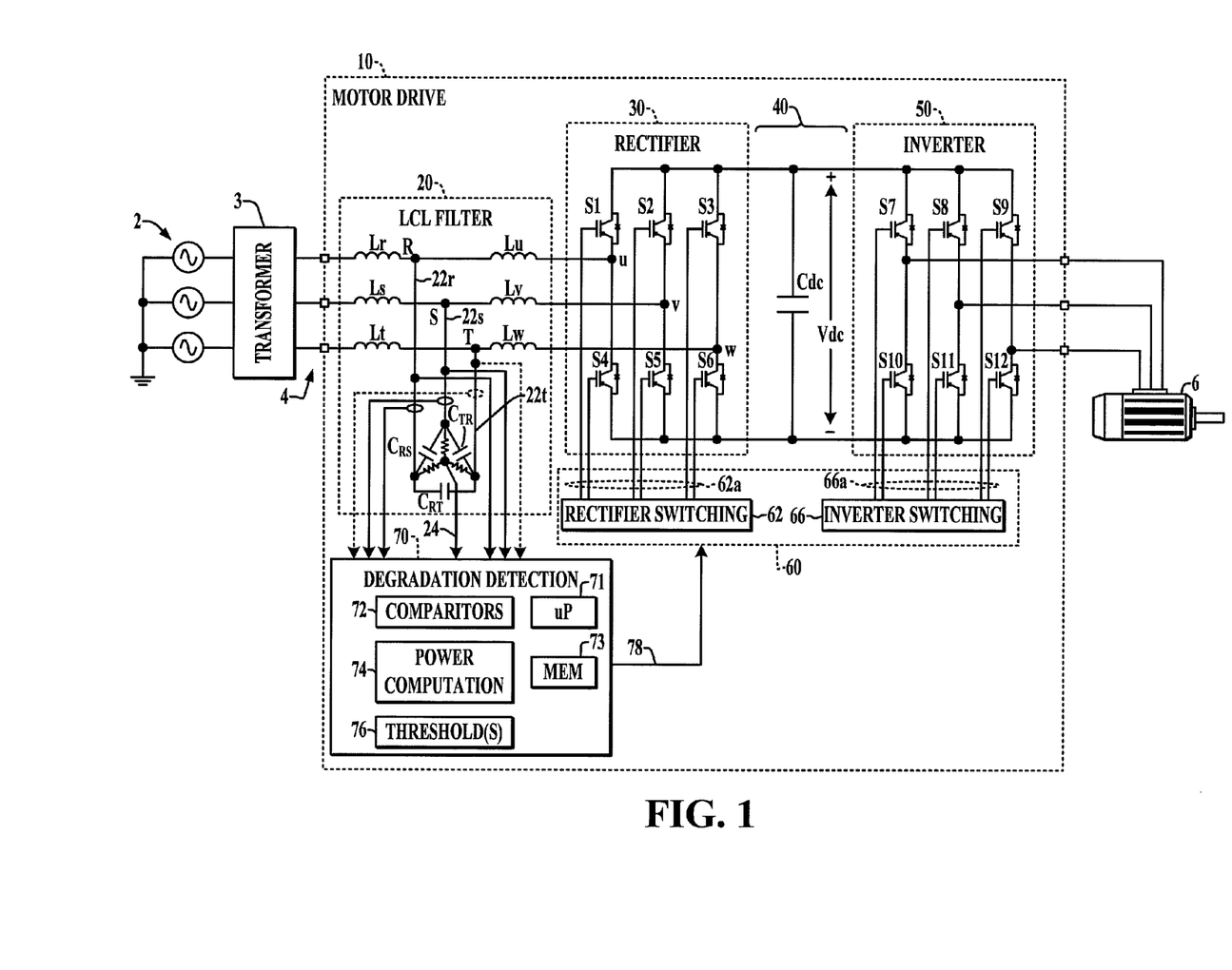
FIG. 1 is a schematic diagram illustrating an exemplary motor drive including an input LCL filter with delta-connected filter capacitors as well as filter capacitor degradation detection apparatus according to one embodiment.
Figure 2:
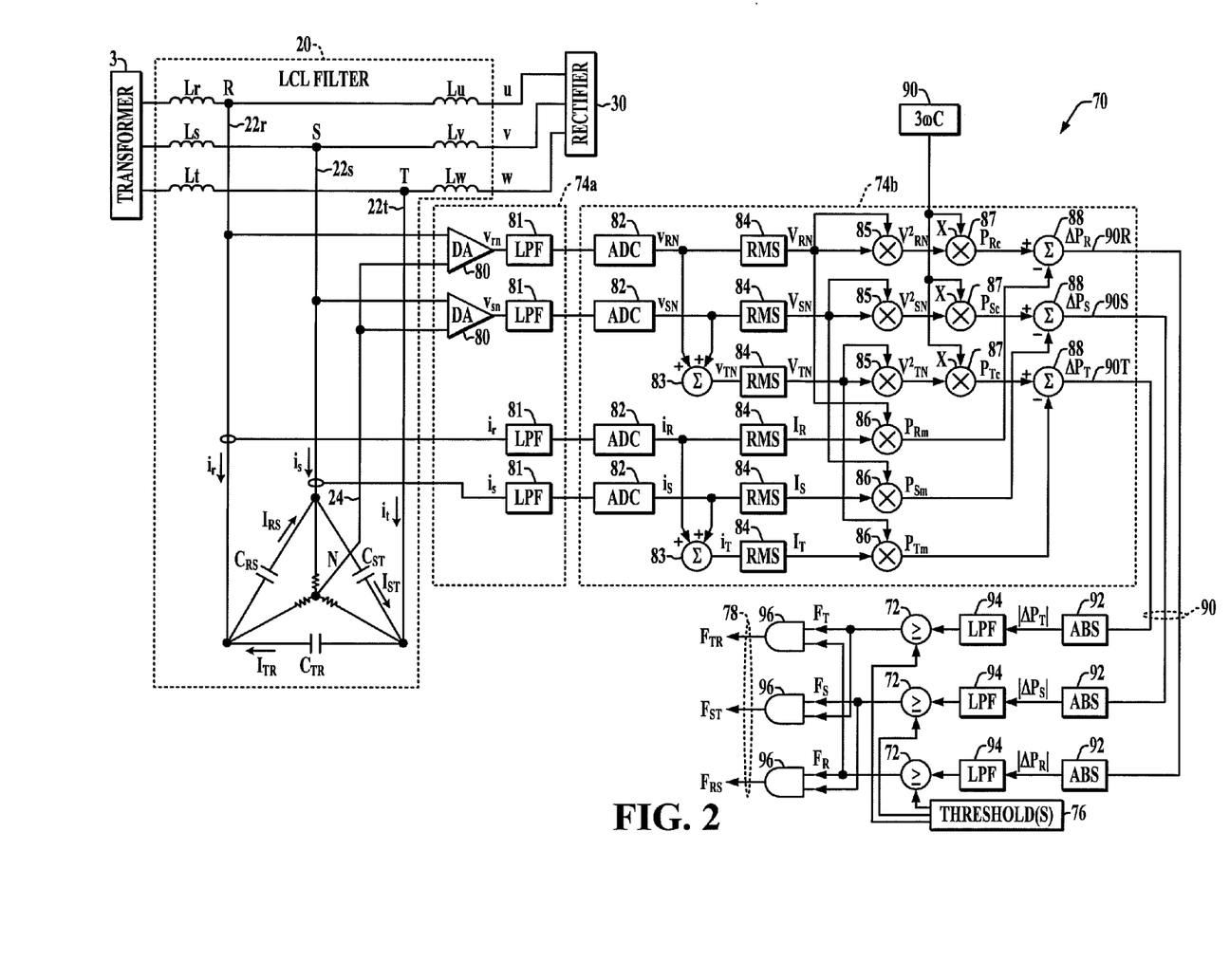
FIG. 2 is a partial schematic diagram illustrating further details of an exemplary degradation detection system in the motor drive of FIG. 1 according to one embodiment.

Referring initially to FIGS. 1 and 2, FIG. 1 illustrates an exemplary active front end motor drive 10 and FIG. 2 depicts an exemplary degradation detection system 70 in the motor drive 10 of FIG. 1 according to one embodiment. The motor drive 10 in FIG. 1 includes a three phase AC input 4 receiving input power from a three-phase source 2 via an optional transformer 3. The drive 10 includes a rectifier 30, an intermediate DC link circuit 40 and an output inverter 50 providing variable frequency, variable amplitude AC output power to drive a motor load 6. Although illustrated and described in the context of a motor drive 10, the various disclosed concepts can be employed in other forms of power converters, whether providing an AC output or a DC output to drive a motor or other type of load 6. The drive input 4 in the illustrated non-limiting example has three input phase terminals which are connected through an LCL input filter circuit 20 to the AC input of the switching (e.g., active front end) rectifier 30. Although the filter circuit 20 in FIGS. 1 and 2 is an "L-C-L" filter having two inductors in each series circuit path between the input 4 and the rectifier 30, the various concepts of the present disclosure can be employed in connection with other filter circuit topologies including without limitation L-C filters, C-L filters, etc. In the illustrated example of FIGS. 1 and 2, the filter circuit 20 includes a set or bank of three capacitors $C_{RS}$, $C_{ST}$ and $C_{TR}$ connected in a delta configuration, along with bleeding or discharge resistors connected between the capacitor terminals and a designated neutral node 24. In operation, capacitors $C_{RS}$, $C_{ST}$ and $C_{TR}$ are discharged upon system shutdown through conduction of discharge currents through the discharge resistors to the designated neutral node 24. Other implementations are possible, for example, in which the capacitor bank of the filter circuit 20 is configured in a "Y" configuration (e.g., capacitors $C_R$, $C_S$ and $C_T$ in FIGS. 4 and 5 below). Moreover, the individual capacitors $C_{RS}$, $C_{ST}$ and $C_{TR}$ or $C_R$, $C_S$ and $C_T$ of the filter circuit 20 can be constructed using single capacitor components, or may be individually constructed as series and/or parallel combinations of multiple capacitive components in various embodiments, and are hereinafter collectively termed "filter capacitors".

The switching rectifier 30 in FIG. 1 is an active front end converter with switching devices S1-S6 individually coupled between a corresponding one of the AC input phases (u, v, w) and a corresponding DC bus terminal (+ or −) of the DC link circuit 40. A drive controller 60 includes a rectifier switching controller 62 operative to provide rectifier switching control signals 62a to the individual rectifier switches S1-S6 to cause the rectifier 30 to convert received three-phase AC input power to provide a DC voltage Vdc across a DC bus capacitance Cdc of the link circuit 40 using any suitable pulse width modulation (PWM) technique. Other embodiments are possible, for example, using a passive rectifier circuitry 30 in conjunction with a filter circuit 20.

The inverter 50 in FIG. 1 receives DC input power from the link circuit 40 and includes inverter switches S7-S12 individually coupled between one of the positive or negative DC bus terminals and a corresponding output phase connected to the motor load 6. The inverter switches S7-S12 are operated according to inverter switching control signals 66a provided by an inverter switching component 66 of the drive controller 60, which generates the signals 66a according to any suitable pulse width modulation technique to convert DC power from the link circuit 40 to provide variable frequency, variable amplitude AC output power to drive the motor load 6.

The switching rectifier 30 and the inverter 50 may employ any suitable form of switching devices S1-S12 including without limitation insulated gate bipolar transistors (IGBTs), silicon controlled rectifiers (SCRs), gate turn-off thyristors (GTOs), integrated gate commutated thyristors (IGCTs), etc. The controller 60 can be any suitable hardware, processor-executed software, processor-executed firmware, programmable logic, analog circuitry, etc. or combinations thereof which provides control signals 62a, 66a for operating the rectifier 30 and the inverter 50, and may implement other functionality associated with operation of the motor drive 10. While the illustrated embodiment includes a switching inverter 50 and associated controller 66, other power converter configurations or embodiments are possible in which the DC power provided at the bus circuit 40 is provided as an output, wherein the inverter 50 and inverter switching controller 66 may be omitted.

The LCL filter circuit 20 in FIGS. 1 and 2 includes three series circuits individually connected between the power converter input 4 and the corresponding phase of the rectifier AC input. Each series circuit includes a pair of series-connected filter inductors, with the first circuit including inductor Lr connected between the first power converter input terminal and a first intermediate node "R", as well as a second filter inductor Lu connected between the intermediate node R and a first rectifier AC input node "u". Similarly, the second series circuit includes a first inductor Ls connected between the second motor drive input and a second intermediate node "S" and a second inductor Lv connected between the node S and the second rectifier input "v", as well as a third series circuit with first and second inductors Lt and Lw joined by a third intermediate node "T". In addition, the filter circuit 20 includes three capacitor circuit branches 22r, 22s and 22t respectively connecting the nodes R, S and T to a delta configuration of three filter capacitors $C_{RS}$, $C_{ST}$ and $C_{TR}$. In this delta-connected capacitor circuit, each filter capacitor is connected to two of the capacitor circuit branches 22 (e.g., line-to-line) as shown. Other non-limiting embodiments are possible in which a CL filter circuit 20 is provided (not shown) for interfacing the motor drive 10 with the power source 2, directly or through a transformer 3, for instance, with the first filter inductors Lr, Ls and Lt omitted due to the inductance of the secondary windings of the transformer 3, and with the input terminals 4 and the capacitor circuit branches 22r, 22s and 22t being connected directly to the inductors Lu, Lv and Lw at the nodes R, S and T, respectively.

As seen in FIGS. 1 and 2, moreover, a degradation detection apparatus or system 70 is operatively coupled with the filter circuit 20, and provides measurement circuitry 74a to sense or otherwise measure line-to-neutral voltages $V_{rn}$ and $V_{sn}$ (and optionally $V_{tn}$), for example, by sensing the voltages at the branch circuits 22 relative to the designated neutral node 24 connecting the capacitor bank bleed resistors as illustrated. As shown in the example of FIG. 2, moreover, the measurement circuitry 74a in certain embodiments need only measure two of the three line-to-designated neutral voltages, in this case $V_{rn}$ and $V_{sn}$, with the remaining line-neutral voltage $V_{tn}$ being computed in a digital power computation component 74b based on the two measured voltage values corresponding to $V_{rn}$ and $V_{sn}$. In addition, the measurement circuitry 74a may include, or couple to, current sensors coupled to the branch circuits 22 to sense the filter circuit branch currents $I_r$, $I_s$ and $I_t$ flowing in the associated capacitor circuit branches 22r, 22s and 22t, respectively.

One embodiment of the degradation detection system 70 is depicted in FIGS. 1 and 2, including a microprocessor element 71 along with an electronic memory 73, comparator circuitry 72 (which may be implemented via the processor 71), a power computation component 74 (which may be implemented via the processor 71) and one or more thresholds 76 (e.g., which may be stored in the memory 73). The degradation detection system 70 can be any suitable hardware, processor-executed software, processor-executed firmware, programmable logic, analog circuitry, etc. or combinations thereof which provides the described capacitor degradation detection functionality, and which may include filtering, RMS computations, power computations and/or threshold comparison functionality in certain embodiments as set forth hereinafter, and the system 70 may be operative using one or more processor elements 71 executing computer executable instructions stored in an electronic memory 73 of the system 70.

As seen in FIGS. 1 and 2, one embodiment of the degradation detection system 70 may include one or more components, some of which may be implemented as software and/or firmware components in execution, programmable logic, etc., including digital power computation component 74b with analog-to-digital conversion (ADC) components 82, multiplication functions 85, 86 and 87, summation functions 83 and 88 (including subtraction), RMS computation components 84, comparators 72, absolute value computation components 92 and digital low pass filter components 94. The electronic memory 73 in certain embodiments may store one or more threshold values 76. The degradation detection system 70 in certain implementations provides one or more output signals or values 78 to identify a detected filter capacitor degradation condition in the filter circuit 20, and the signals or values 78 may include or otherwise provide an identification of a suspected degrading or degraded filter capacitor $C_{RS}$, $C_{ST}$ and/or $C_{TR}$ of the filter circuit 20. As illustrated in FIG. 1, the degradation detection signal(s) or value(s) 78 may be provided to the motor drive controller 60 to initiate one or more actions, such as shutting down the motor drive 10 and/or providing an alert or warning signal or other indication, for instance, to a user interface associated with the motor drive 10 and/or to a connected network (not shown).

As best seen in FIG. 2, the illustrated example includes measurement circuitry 74a as well as digital processing circuitry or processor-implemented logic 74b for power computation, as well as comparator functions 72 to compare power change values 90 provided from the component 74b with one or more thresholds 76 for selective provision of one or more filter capacitor degradation condition signals or values 78, thus providing a non-limiting embodiment of the power computation component 74 in FIG. 1. In this embodiment, the system 70 includes analog measurement circuitry 74a with differential amplifiers 80 measuring filter circuit line-to-designated neutral voltages $v_{rn}$ and $v_{sn}$, as well as analog low pass filter (LPF) circuits 81 operative to low pass filter the measured filter circuit voltages $v_{rn}$ and $v_{sn}$. In addition, current sensor inputs $i_r$ and $i_s$ are provided to corresponding low pass filter circuits 81 for filtering measured filter circuit branch currents sensed along the capacitor circuit branches 22r and 22s, respectively. In one possible implementation, the low pass filter circuits 81 have a cutoff frequency above the operating frequency of the system 10. For example, a cutoff frequency of approximately 80 Hz can be used for a motor drive system 10 operating from a 50 Hz or 60 Hz supply in one non-limiting embodiment. The illustrated measurement system 74a and logic 74b advantageously provide for computation of a third line-designated neutral voltage $v_{tn}$ as well as a third branch current $i_t$ without requiring corresponding differential amplifier circuitry 80, low pass filter circuits 81 and/or ADC components 82, although other embodiments are possible in which these voltage and current signals are measured, low pass filtered and converted separately.

Analog-to-digital converters 82 are provided for concurrent sampling and conversion of the measured filter circuit voltages $v_{rn}$ and $v_{sn}$ (and optionally $v_{tn}$) and filter branch currents $i_r$ and $i_s$ (and optionally $i_t$), with the converters 82 providing converted digital values $v_{RN}$ and $v_{SN}$ (and optionally and $v_{TN}$) representing the line-neutral voltages provided to the capacitor bank, as well as converted digital values $i_R$ and $i_S$ (and optionally $i_T$) representing the measured filter circuit branch currents. In this regard, the use of separate ADC stages 82 operating concurrently in the example of FIG. 2 for each of the measured values advantageously ensures that the resulting measured and nominal power comparisons correspond with one another, and further ensures that the optionally computed third voltage and current values ($v_{TN}$ and $i_t$) are accurate, and thus the concepts of the present disclosure present a significant advantage in detecting capacitor degradation compared to multiplexing the inputs to a single shared analog-to-digital converter.

The digital processing component 74b in FIG. 2 includes summation components 83 by which the non-measured voltage and current values $v_{TN}$ and $i_T$ are computed based on the measured and converted digital values. In the illustrated case, for example, the line-neutral voltage value $v_{TN}$ is computed as the sum of $v_{RN}+v_{SN}$, and the current value $i_T$ is computed as the sum of the converted values ($i_R$ and $i_S$) corresponding to the measured branch currents $i_r$ and $i_s$. The digital values for the voltages $v_{RN}$, $v_{SN}$ and $v_{TN}$ and those for the currents $i_R$, $i_S$ and $i_T$ are provided in the illustrated implementation to RMS computation components 84 for computation of corresponding RMS voltage and current values $V_{RN}$, $V_{SN}$ and $V_{TN}$, and $I_R$, $I_S$ and $I_T$, although the components 84 may be omitted in certain embodiments.

The digital processing 74b computes a plurality of nominal filter circuit power values $P_{Rc}$, $P_{Sc}$ and $P_{Tc}$ using the measured filter circuit voltages $V_{RN}$, $V_{SN}$ and $V_{TN}$, a filter operating frequency ω, and one or more nominal capacitance values C as $P_{ic}=V^2_{iN}*3\omega C$, with the multipliers 85 computing the square of the corresponding filter circuit voltage values, and the subsequent multipliers 87 dividing these values by the nominal capacitor circuit impedance (1/3ωC), which can be a value or values 90, for example, stored in the memory 73 of the degradation detection system 70. In this non-limiting example, for instance, the computed nominal filter circuit power values $P_{Rc}$, $P_{Sc}$ and $P_{Tc}$ represent the ideal or nominal power associated with the corresponding circuit branch 22 in the filter circuit 20, although other implementations are possible in which line-line or other power measurement values are computed based on measured voltage values associated with the filter circuit 20. In this regard, the nominal power values computed via the multipliers 85 and 87 are independent of the measured current, and thus represent the expected power in the situation where the filter circuit capacitances are at or near the nominal capacitance values C for a given operating voltage level. Although illustrated as performing the multiplications via the multiplier components 85 and 87 for each measurement sample, other embodiments are possible in which the system 70 employs a lookup table or other suitable means for indexing a currently measured voltage value (e.g., RMS) with respect to a previously computed value of 3ωC to reduce the number of computations performed in real time.

In addition, the digital processing 74b includes multipliers 86 used to compute a plurality of measured filter circuit power values $P_{Rm}$, $P_{Sm}$ and $P_{Tm}$ using the RMS measured filter circuit voltage values $V_{RN}$, $V_{SN}$ and $V_{TN}$ and filter circuit branch current values $I_R$, $I_S$ and $I_T$. In this example, the individual measured filter circuit power values $P_{Rm}$, $P_{Sm}$ and $P_{Tm}$ are computed as a product of the corresponding RMS filter circuit voltage value $V_{RN}$, $V_{SN}$ and $V_{TN}$ measured between the corresponding filter branch circuit 22 and the designated neutral node 24, multiplied by the corresponding measured filter circuit branch current $I_R$, $I_S$ and $I_T$ flowing in the corresponding filter branch circuit 22. Thus, the computed measured filter circuit power values $P_{Rm}$, $P_{Sm}$ and $P_{Tm}$ should ideally be similar or equal to the nominal power values absent filter circuit capacitor degradation, in which case one or more of the branch circuit currents and hence the measured power values may deviate from the expected value.

The digital processing logic 74b further includes summation components 88 performing subtraction operations to compute power change values 90R, 90S and 90T ($\Delta P_R$, $\Delta P_S$ and $\Delta P_T$) representing deviations of individual measured filter circuit power values $P_{Rm}$, $P_{Sm}$ and $P_{Tm}$ from the corresponding nominal filter circuit power values $P_{Rc}$, $P_{Sc}$ and $P_{Tc}$, respectively. In the illustrated example, for instance, the summation components 88 perform a subtraction operation to subtract the measured power values from the nominal values to obtain the power change values 90. As further seen in the embodiment of FIG. 2, the system 70 may further include absolute value components 92 receiving the power change values 90 and respectively providing absolute power change values $|\Delta P_R|$, $|\Delta P_S|$ and $|\Delta P_T|$ for the individual power change values $\Delta P_R$, $\Delta P_S$ and $\Delta P_T$, which are then low pass filtered via digital low pass filter computation components 94 in the illustrated example. In certain embodiments, the absolute value computation may be omitted and/or the low pass filtering via the filters 94 may be omitted.

The filtered absolute power change values $|\Delta P_R|$, $|\Delta P_S|$ and $|\Delta P_T|$ in the example of FIG. 2 are then compared with one or more corresponding threshold values 76 via comparators 72 to provide corresponding fault indication outputs $F_R$, $F_S$ and $F_T$, and the outputs of the comparators 72 are provided in one example to logic gates (AND gates) 96, with the system 70 selectively identifying one or more capacitor degradation conditions in the filter circuit 20 at least partially according to the power change values 90. The power change value thresholds 76 may be set in certain embodiments according to a predetermined amount (e.g. 20% in one example) of tolerable variation in the capacitance value of the filter circuit capacitors $C_{RS}$, $C_{ST}$ and $C_{TR}$. In the example of FIG. 2, moreover, one or more filter capacitor degradation signals or values 78 are provided by the system 70 via the gates 96 to selectively identify a given filter capacitor as degrading for which power change values $\Delta P_R$, $\Delta P_S$, $\Delta P_T$ associated with two filter branch circuits 22 connected to the given filter capacitor are both greater than or equal to the corresponding threshold value 76. This case, for example, provides a signal or value $F_{TR}$ which, when asserted, indicates degradation of the filter capacitor $C_{TR}$ if the corresponding filtered absolute power change values $|\Delta P_R|$ and $|\Delta P_S|$ are both greater than or equal to the corresponding thresholds 76 with which they are compared via the comparators 72 (e.g., $F_R$ and $F_T$ both asserted). In this regard, $C_{RS}$, $C_{ST}$, $C_{TR}$ in the illustrated delta configuration will be an equivalent capacitance in star configuration (e.g., similar to $C_R$, $C_S$, $C_T$) with values of 3C, respectively, and thus a change in $C_{TR}$ will affect the power measurements $P_R$ and $P_S$. This exemplary algorithm for the illustrated delta configuration thus advantageously facilitates power estimation and measurement despite the non-accessibility for direct sensing of the capacitor currents flowing in the delta circuit using the available line currents only. Likewise, suspected degradation of $C_{RS}$ is selectively indicated via signal or value 78 $F_{RS}$ if $|\Delta P_R|\geq$threshold 76 and $|\Delta P_S|\geq$threshold 76, and degradation of $C_{ST}$ is selectively indicated via signal or value 78 $F_{RS}$ if $|\Delta P_S|\geq$threshold 76 and $|\Delta P_T|\geq$threshold 76. In the illustrated embodiment, the system 70 employs comparators 72 (which can be implemented in hardware, processor-executed software, processor-executed firmware, programmable logic, etc.) to compare the computed power change values with one or more thresholds 76. As further seen in FIG. 1, moreover, the system 70 in certain embodiments may be implemented using a microprocessor 71 programmed with corresponding computer-executable instructions stored in a non-transitory computer readable medium such as the memory 73, and the system 70 may be implemented in a processor or processors used in the controller 60 for operating the rectifier 30 and inverter 50, or in a separate processor or processors.

Figure 3:
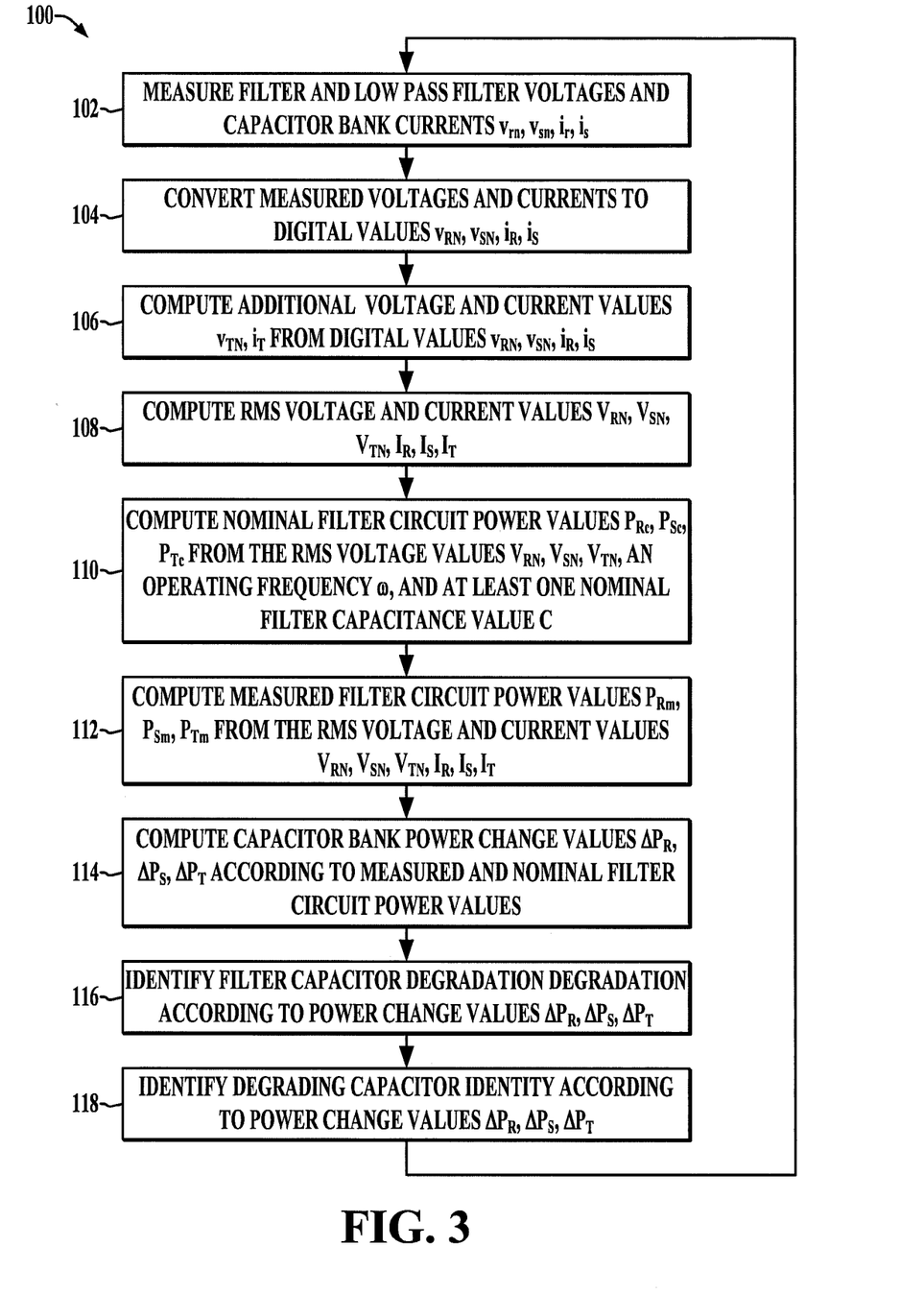
FIG. 3 is a flow diagram illustrating an exemplary process for detecting filter capacitor degradation according to one embodiment.

FIG. 3 provides a flow diagram illustrating an exemplary process 100 for detecting filter capacitor degradation according to one embodiment. While the method 100 is illustrated and described as a series of acts or events, the methods of the present disclosure are not limited by the illustrated ordering of such acts or events except as specifically set forth herein. Except as specifically provided hereinafter, some acts or events may occur in different order and/or concurrently with other acts or events apart from those illustrated and described herein, and not all illustrated steps may be required to implement a process or method in accordance with the present disclosure. The illustrated methods may be implemented in hardware, processor-executed software or processor-executed firmware, or combinations thereof, and various embodiments or implementations include non-transitory computer readable mediums having computer-executable instructions for performing the illustrated and described methods. For example, the method 100 may be implemented by using analog circuitry 74a and a processor 71 as described herein using program instructions for filter capacitor degradation detection or identification, with various instructions and data being stored in the electronic memory 73 associated with the processor 71, although the method 100 can be implemented in other systems, including without limitation those illustrated and described herein.

Beginning at 102 in FIG. 3, the process 100 involves computation of nominal filter circuit power values ($P_{Rc}$, $P_{Sc}$, $P_{Tc}$) at 110 and measured filter circuit power values ($P_{Rm}$, $P_{Sm}$, $P_{Tm}$) at 112, as well as computation of power change values 90 at 114 for use in selective identification at 116 of one or more capacitor degradation conditions in the filter circuit 20. In the illustrated process 100, the filter voltages and capacitor bank currents are measured and filtered at 102 (e.g., line-neutral voltage measurements and branch current measurements in the delta-connected example of FIGS. 1 and 2), and these are converted to digital values at 104. In certain embodiments, these are measured concurrently, for example using corresponding analog-to-digital converters 82 as in FIG. 2 above. In the illustrated embodiment, moreover, additional voltage and current values are optionally computed at 106 from the measured and converted digital voltage and current values (e.g., via the summation components 83 in FIG. 2 above). At 108, RMS voltage and current values are optionally computed (e.g., via RMS computation components 84 in FIG. 2).

At 110 in FIG. 3, the nominal filter circuit power values $P_{Rc}$, $P_{Sc}$ and $P_{Tc}$ are computed (e.g., via the multipliers 85 and 87 using the operating frequency and nominal capacitance value(s) 90 in FIG. 2), and the measured filter circuit power values ($P_{Rm}$, $P_{Sm}$, $P_{Tm}$) are computed at 112 (e.g., via multipliers 86 in FIG. 2 or other suitable means). At 114, capacitor bank power change values $\Delta P_R$, $\Delta P_S$ and $\Delta P_T$ are computed, representing deviations of individual measured filter circuit power values $P_{Rm}$, $P_{Sm}$ and $P_{Tm}$ from the corresponding nominal filter circuit power values $P_{Rc}$, $P_{Sc}$ and $P_{Tc}$. The process 100 further includes identifying a capacitor degradation condition in the filter circuit at 116 at least partially according to the power change values $\Delta P_R$, $\Delta P_S$ and $\Delta P_T$. In certain embodiments, moreover, the process 100 further includes identifying one or more particular degrading capacitors at 118 according to the power change values $\Delta P_R$, $\Delta P_S$ and/or $\Delta P_T$.

Figure 4:
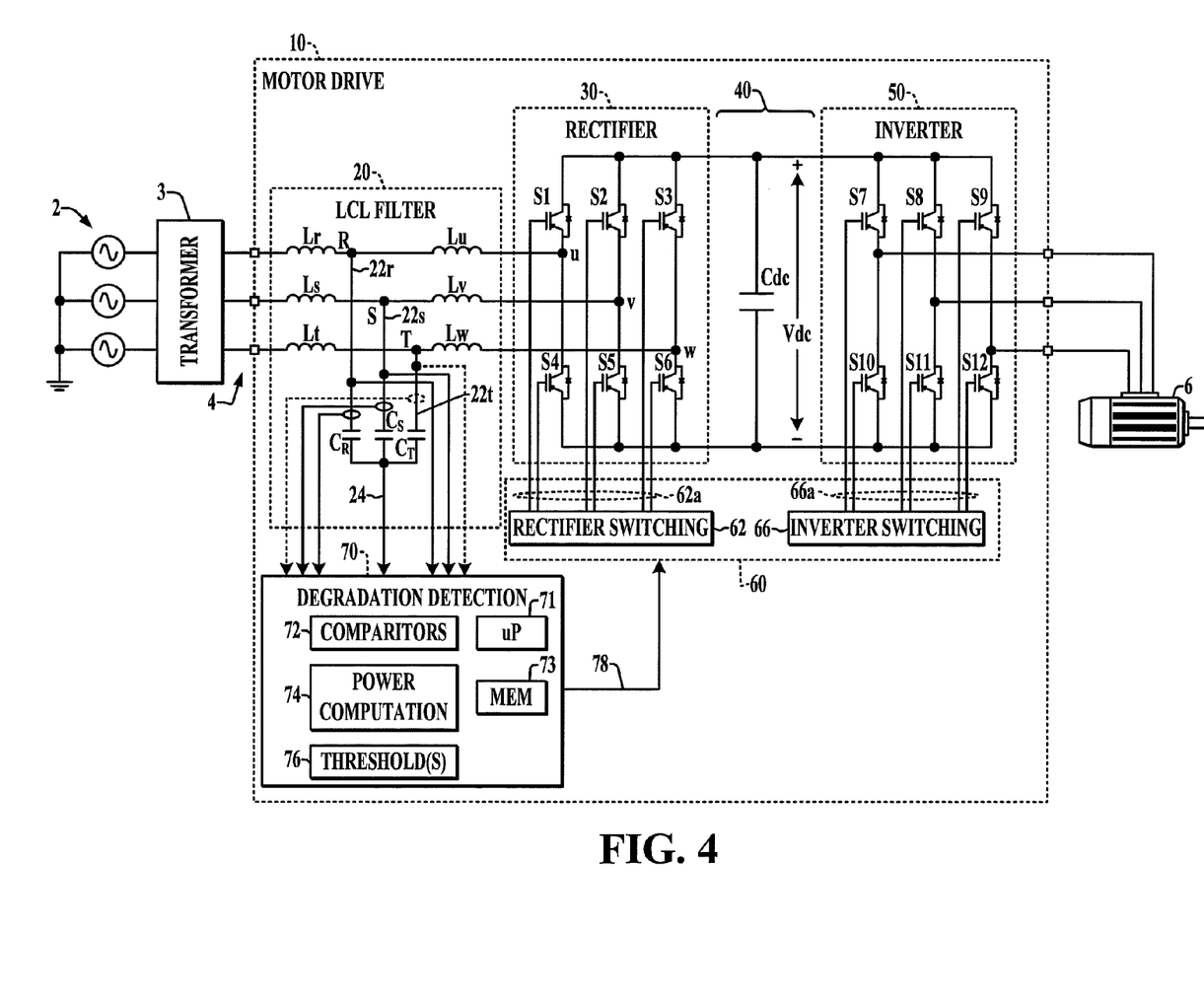
FIG. 4 is a schematic diagram illustrating another exemplary motor drive with an input LCL filter having a Y-connected filter capacitor bank, and a degradation detection system according to one embodiment.
Figure 5:
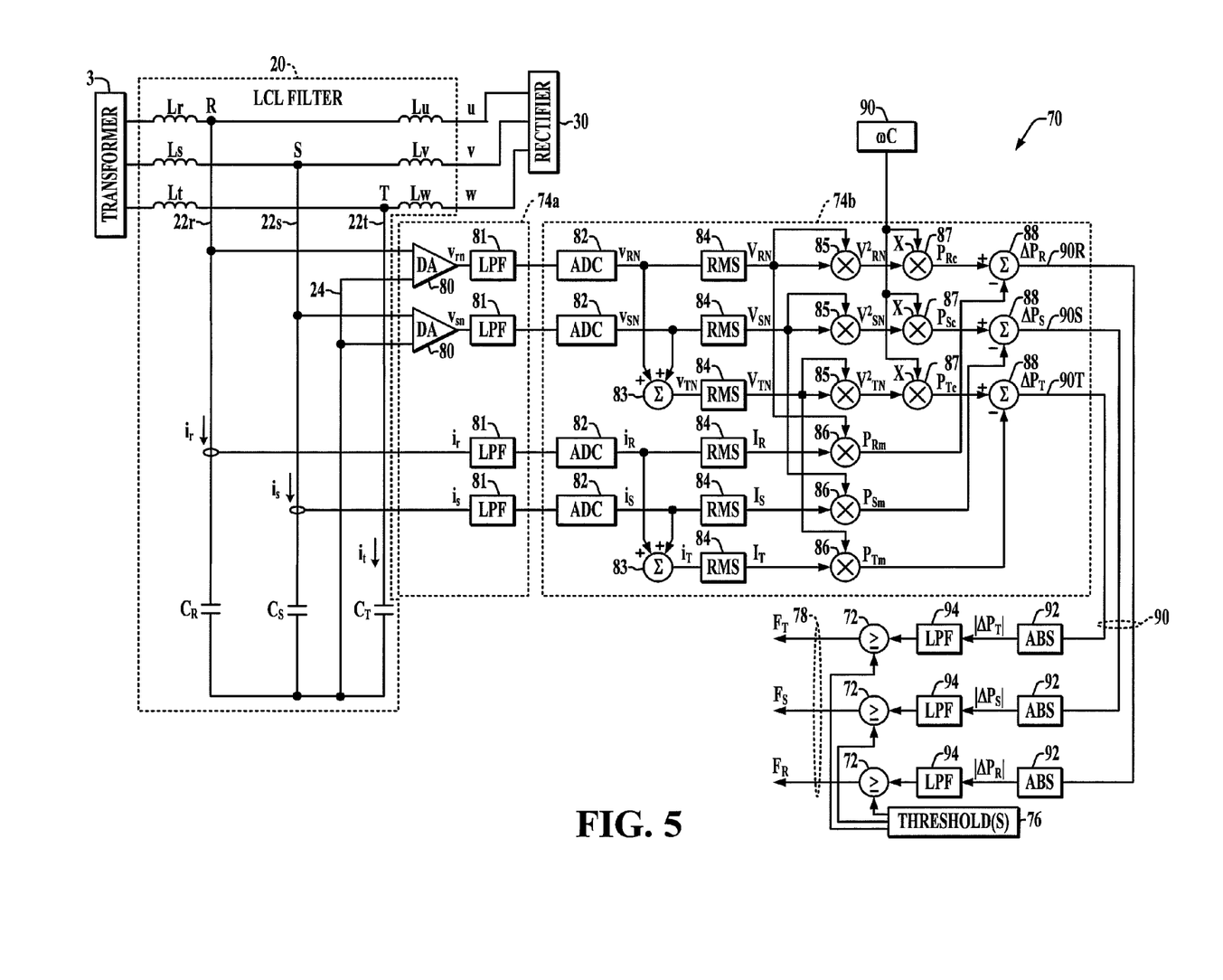
FIG. 5 is a partial schematic diagram illustrating further details of an exemplary degradation detection system in the motor drive of FIG. 5 according to one embodiment.

Referring also to FIGS. 4 and 5, another motor drive power converter embodiment 10 is shown, including an LCL filter circuit 20, a rectifier 30, intermediate DC link circuit 40 and inverter 50 operated by a motor drive controller 60 generally as described above to power a motor or other AC load 6 using power from an AC input source 2. The LCL filter 20 in this embodiment includes series circuits individually including two series-connected inductors (Lr and Lu, etc.) with corresponding capacitor circuit branches 22 connecting the series circuits with three filter capacitors $C_R$, $C_S$ and $C_T$ connected in a Y configuration with each filter capacitor C connected between a corresponding one of the capacitor circuit branches 22 and a common connection node 24 (e.g., a neutral node). Other embodiments are possible in which the filter circuit 20 is an L-C configuration with only a single inductor in each of the series circuits, such as where the motor drive 10 is used in combination with an input transformer 3, in which case the inductors Lr, Ls and Lt can be omitted.

The exemplary circuit 74a in FIG. 5 is constructed in generally the same manner as that shown in FIG. 2 above, with the differential amplifiers 80 measuring line-neutral voltages $v_{rn}$ and $v_{sn}$ (and optionally $v_{tn}$), where these voltages and the measured branch currents $i_r$ and $i_s$ (and optionally $i_t$) are low pass filtered via filter circuits 81 and converted to digital form via the analog-to-digital converters 82. In certain embodiments, the converters 82 operate concurrently to sample and convert the corresponding voltages and currents, with the converted voltages representing line-to-neutral voltages $v_{RN}$ and $v_{SN}$ as shown in FIG. 5. The non-measured voltage and current values $v_{TN}$ and $i_T$ in the example of FIG. 5 are computed based on the measured and converted digital values via the summation components 83 as described above, and the digital values for the voltages $v_{RN}$, $v_{SN}$ and $v_{TN}$ and for the currents $i_R$, $i_S$ and $i_T$ are provided to RMS computation components 84 for computation of corresponding RMS voltage and current values $V_{RN}$, $V_{SN}$ and $V_{TN}$, and $I_R$, $I_S$ and $I_T$, although the components 84 may be omitted in certain embodiments. The measurements of fewer than all three currents in this case is advantageous where the neutral is floating and not connected, whereas separate measurement of all three currents is advantageous if the neutral is grounded or connected to the supply neutral to accommodate any unbalance causing a neutral current to flow.

Nominal filter circuit power values $P_{Rc}$, $P_{Sc}$ and $P_{Tc}$ are computed via multipliers 85 and 87 and the value or values 90 ($\omega C$, without multiplying by 3 in the case of the Y-connected capacitor bank in the filter 20) using the measured filter circuit voltages $V_{RN}$, $V_{SN}$ and $V_{TN}$, the filter operating frequency $\omega$, and one or more nominal capacitance values C as $P_{ic} = V^2_{iN} * \omega C$, where the multipliers 85 compute the squared filter circuit voltage values $V^2_{RN}$, $V^2_{SN}$ and $V^2_{TN}$, and the multipliers 87 multiply these values by the reciprocal of the nominal capacitor circuit impedance ($\omega C$), which can be a value or values 90, for example, stored in the memory 73 of the degradation detection system 70.

As in the above-described delta case, the computed nominal filter circuit power values $P_{Rc}$, $P_{Sc}$ and $P_{Tc}$ in the Y-connected example of FIGS. 4 and 5 represent the ideal or nominal power associated with the corresponding circuit branch 22 in the filter circuit 20. Other implementations are possible in which line-line or other power measurement values are computed based on the measured voltage values associated with the filter circuit 20. As with the above example, moreover, the nominal power values computed in FIG. 5 via the multipliers 85 and 87 are independent of the measured current, and thus represent the expected power in the situation where the filter circuit capacitances are at or near the nominal capacitance values C.

Multipliers 86 are used in FIG. 5 to compute a plurality of measured filter circuit power values $P_{Rm}$, $P_{Sm}$ and $P_{Tm}$ using the RMS measured filter circuit voltage values $V_{RN}$, $V_{SN}$ and $V_{TN}$ and filter circuit branch current values $I_R$, $I_S$ and $I_T$ (e.g., as a product of the corresponding RMS filter circuit voltage value $V_{RN}$, $V_{SN}$ and $V_{TN}$ measured between the corresponding filter branch circuit 22 and the neutral 24, multiplied by the corresponding measured filter circuit branch current $I_R$, $I_S$ and $I_T$ flowing in the corresponding filter branch circuit 22). The logic 74b in FIG. 5 also includes summation components 88 to compute (e.g., via subtraction) power change values 90 representing deviations of individual measured filter circuit power values $P_{Rm}$, $P_{Sm}$ and $P_{Tm}$ from the corresponding nominal filter circuit power values $P_{Rc}$, $P_{Sc}$ and $P_{Tc}$, and the system 70 may include absolute value components 92 providing absolute power change values $|\Delta P_R|$, $|\Delta P_S|$ and $|\Delta P_T|$ and digital low pass filter computation components 94, where the absolute value computation and/or the low pass filtering may be omitted in certain embodiments.

In the Y-connected case of FIG. 5, comparators 72 are provided to compare the filtered absolute power change values $|\Delta P_R|$, $|\Delta P_S|$ and $|\Delta P_T|$ with one or more threshold values 76 to selectively provide corresponding fault indication outputs $F_R$, $F_S$ and $F_T$, which when asserted, directly indicate suspected degradation of the corresponding filter capacitor $C_R$, $C_C$ and/or $C_T$ in the Y-configuration. The filter capacitor degradation detection system 70 in this case operates as described above in connection with FIG. 3 with the system 70 measuring filter circuit branch currents and voltages associated with the filter 20, computing nominal filter power values using the measured voltages, the filter operating frequency and one or more nominal capacitance values, computing measured power values, and computing the power change values representing deviations of the individual measured power values from the corresponding nominal power values. The system 70 selectively identifies one or more filter capacitor degradation conditions in the filter circuit 20 at least partially according to the power change values as discussed above. In certain implementations, the system 70 may employ different threshold values 76 for a Y-connected filter circuit capacitor bank, where the power change value thresholds 76 may be set according to a predetermined amount (e.g. 20% in one example) of tolerable variation in the capacitance value of the filter circuit capacitors $C_R$, $C_S$ and $C_T$.

The above examples are merely illustrative of several possible embodiments of various aspects of the present disclosure, wherein equivalent alterations and/or modifications will occur to others skilled in the art upon reading and understanding this specification and the annexed drawings. In particular regard to the various functions performed by the above described components (assemblies, devices, systems, circuits, and the like), the terms (including a reference to a "means") used to describe such components are intended to correspond, unless otherwise indicated, to any component, such as hardware, processor-executed software, or combinations thereof, which performs the specified function of the described component (i.e., that is functionally equivalent), even though not structurally equivalent to the disclosed structure which performs the function in the illustrated implementations of the disclosure. In addition, although a particular feature of the disclosure may have been disclosed with respect to only one of several implementations, such feature may be combined with one or more other features of the other implementations as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising". This description uses examples to disclose various embodiments and also to enable any person skilled in the art to practice the disclosed subject matter, including making and using any devices or systems and performing any incorporated methods. It will be evident that various modifications and changes may be made, and additional embodiments may be implemented, without departing from the broader scope of the present disclosure as set forth in the following claims, wherein the specification and drawings are to be regarded in an illustrative rather than restrictive sense.

The following is claimed:

1. A method for detecting capacitor degradation in a filter circuit, the method comprising:
    measuring a plurality of filter circuit branch currents associated with the filter circuit;
    measuring a plurality of filter circuit voltages associated with the filter circuit;
    computing a plurality of nominal filter circuit power values using the measured plurality of filter circuit voltages, a filter operating frequency, and at least one nominal capacitance value;
    computing a plurality of measured filter circuit power values using the measured plurality of filter circuit voltages and the measured plurality of filter circuit branch currents;
    computing a plurality of power change values representing deviations of individual measured filter circuit power values from the corresponding nominal filter circuit power values; and
    selectively identifying a capacitor degradation condition in the filter circuit at least partially according to the plurality of power change values;
    wherein the filter circuit includes filter capacitors connected in a delta configuration;
    wherein individual nominal filter circuit power values are computed as a product of:
        a square of a corresponding filter circuit voltage value measured between a corresponding filter branch circuit and a designated neutral node,
        the filter operating frequency, and
        three times the at least one nominal capacitance value; and
    wherein individual measured filter circuit power values are computed as a product of the corresponding filter circuit voltage value measured between the corresponding filter branch circuit and the designated neutral node, and a corresponding measured filter circuit branch current flowing in the corresponding filter branch circuit.

2. The method of claim 1, comprising selectively identifying at least one degrading capacitor in the filter circuit at least partially according to the plurality of power change values.

3. The method of claim 1, wherein the selectively identifying at least one degrading capacitor comprises identifying a given filter capacitor as degrading for which power change values associated with two filter branch circuits connected to the given filter capacitor are both greater than or equal to a corresponding threshold value.

4. The method of claim 1, wherein the plurality of filter circuit branch currents and the plurality of filter circuit voltages are measured concurrently.

5. The method of claim 1, wherein individual power change values are computed as a difference between a corresponding nominal filter circuit power value and a corresponding measured filter circuit power value; and wherein selectively identifying a capacitor degradation condition in the filter circuit comprises determining whether the individual power change values are greater than or equal to a threshold value.

6. The method of claim 5, comprising computing absolute power change values for the individual power change values;
    wherein selectively identifying a capacitor degradation condition in the filter circuit comprises determining whether the individual absolute power change values are greater than or equal to the threshold value.

7. The method of claim 1, comprising:
computing root-mean-square (RMS) voltage values at least partially according to the measured plurality of filter circuit voltages; and
computing RMS current values at least partially according to the measured plurality of filter circuit branch currents;
wherein the nominal filter circuit power values and the measured filter circuit power values are computed at least partially according to the RMS voltage values and the RMS current values.

8. A method for detecting capacitor degradation in a filter circuit, the method comprising:
measuring a plurality of filter circuit branch currents associated with the filter circuit;
measuring a plurality of filter circuit voltages associated with the filter circuit;
computing a plurality of nominal filter circuit power values using the measured plurality of filter circuit voltages, a filter operating frequency, and at least one nominal capacitance value;
computing a plurality of measured filter circuit power values using the measured plurality of filter circuit voltages and the measured plurality of filter circuit branch currents;
computing a plurality of power change values representing deviations of individual measured filter circuit power values from the corresponding nominal filter circuit power values; and
selectively identifying a capacitor degradation condition in the filter circuit at least partially according to the plurality of power change values;
wherein the filter circuit includes filter capacitors connected in a Y configuration;
wherein individual nominal filter circuit power values are computed as a product of:
a square of a corresponding filter circuit voltage value measured between a corresponding filter branch circuit and a designated neutral node,
the filter operating frequency, and
the at least one nominal capacitance value; and
wherein individual measured filter circuit power values are computed as a product of the corresponding filter circuit voltage value measured between the corresponding filter branch circuit and the designated neutral node, and a corresponding measured filter circuit branch current flowing in the corresponding filter branch circuit.

9. The method of claim 8, wherein the selectively identifying at least one degrading capacitor comprises identifying a given filter capacitor connected between a given branch circuit and a neutral node of the filter circuit as degrading for which a power change value associated with the given branch circuit is greater than or equal to a corresponding threshold value.

10. The method of claim 8, comprising selectively identifying at least one degrading capacitor in the filter circuit at least partially according to the plurality of power change values.

11. The method of claim 8, wherein individual power change values are computed as a difference between a corresponding nominal filter circuit power value and a corresponding measured filter circuit power value; and
wherein selectively identifying a capacitor degradation condition in the filter circuit comprises determining whether the individual power change values are greater than or equal to a threshold value.

12. The method of claim 11, comprising computing absolute power change values for the individual power change values;
wherein selectively identifying a capacitor degradation condition in the filter circuit comprises determining whether the individual absolute power change values are greater than or equal to the threshold value.

13. The method of claim 8, comprising:
computing root-mean-square (RMS) voltage values at least partially according to the measured plurality of filter circuit voltages; and
computing RMS current values at least partially according to the measured filter circuit branch currents;
wherein the nominal filter circuit power values and the measured filter circuit power values are computed at least partially according to the RMS voltage values and the RMS current values.

14. A non-transitory computer readable medium, comprising computer executable instructions for:
computing a plurality of nominal filter circuit power values using a plurality of measured filter circuit voltages associated with a filter circuit, a filter operating frequency, and at least one nominal capacitance value;
computing a plurality of measured filter circuit power values using the plurality of measured filter circuit voltages and a plurality of measured filter circuit branch currents associated with the filter circuit;
computing a plurality of power change values representing deviations of individual measured filter circuit power values from corresponding nominal filter circuit power values;
selectively identifying a capacitor degradation condition in the filter circuit at least partially according to the plurality of power change values;
computing individual nominal filter circuit power values as a product of:
a square of a corresponding filter circuit voltage value measured between a corresponding filter branch circuit and a designated neutral node,
three times the filter operating frequency, and
the at least one nominal capacitance value; and
computing individual measured filter circuit power values as a product of the corresponding filter circuit voltage value measured between the corresponding filter branch circuit and the designated neutral node, and a corresponding measured filter circuit branch current flowing in the corresponding filter branch circuit.

15. The non-transitory computer readable medium of claim 14, comprising computer executable instructions for selectively identifying at least one degrading capacitor in the filter circuit at least partially according to the plurality of power change values.

16. A non-transitory computer readable medium, comprising computer executable instructions for:
computing a plurality of nominal filter circuit power values using a plurality of measured filter circuit voltages associated with a filter circuit, a filter operating frequency, and at least one nominal capacitance value;
computing a plurality of measured filter circuit power values using the plurality of measured filter circuit voltages and a plurality of measured filter circuit branch currents associated with the filter circuit;

computing a plurality of power change values representing deviations of individual measured filter circuit power values from corresponding nominal filter circuit power values;

selectively identifying a capacitor degradation condition in the filter circuit at least partially according to the plurality of power change values;

computing individual nominal filter circuit power values as a product of:
- a square of a corresponding filter circuit voltage value measured between a corresponding filter branch circuit and a designated neutral node,
- the filter operating frequency, and
- the at least one nominal capacitance value; and computing individual measured filter circuit power values as a product of the corresponding filter circuit voltage value measured between the corresponding filter branch circuit and the designated neutral node, and a corresponding measured filter circuit branch current flowing in the corresponding filter branch circuit.

17. The non-transitory computer readable medium of claim 16, comprising computer executable instructions for selectively identifying at least one degrading capacitor in the filter circuit at least partially according to the power change values.

18. A power conversion system, comprising:
a power converter input operative to receive multiphase AC input power;
a rectifier;
a filter circuit coupled between the power converter input and the rectifier, the filter circuit comprising first, second, and third series circuits individually including at least one filter inductor coupled between a corresponding phase of the power converter input and a corresponding phase of the three phase AC input of the rectifier, first, second, and third capacitor circuit branches respectively connected to the first, second and third series circuits, and three filter capacitors with each filter capacitor being connected to at least one of the capacitor circuit branches;
a measurement circuit operatively coupled with the input filter circuit to measure a plurality of filter circuit branch currents associated with the capacitor circuit branches, and to measure a plurality of filter circuit voltages associated with the filter circuit; and
at least one processor programmed to:
compute a plurality of nominal filter circuit power values using the measured filter circuit voltages, a filter operating frequency, and at least one nominal capacitance value,
compute a plurality of measured filter circuit power values using the measured filter circuit voltages and the measured filter circuit branch currents,
compute a plurality of power change values representing deviations of individual measured filter circuit power values from the corresponding nominal filter circuit power values, and
selectively identify a capacitor degradation condition in the filter circuit at least partially according to the power change values;
wherein the filter circuit includes filter capacitors connected in a delta configuration;
wherein individual nominal filter circuit power values are computed as a product of:
a square of a corresponding filter circuit voltage value measured between a corresponding filter branch circuit and a designated neutral node,
the filter operating frequency, and
three times the at least one nominal capacitance value; and
wherein individual measured filter circuit power values are computed as a product of the corresponding filter circuit voltage value measured between the corresponding filter branch circuit and the designated neutral node, and a corresponding measured filter circuit branch current flowing in the corresponding filter branch circuit.

19. The power conversion system of claim 18, wherein the at least one processor is programmed to selectively identify at least one degrading capacitor in the filter circuit at least partially according to the plurality of power change values.

20. The power conversion system of claim 19, wherein the filter circuit includes filter capacitors connected in a delta configuration, and wherein the at least one processor is programmed to identify a given filter capacitor as degrading for which power change values associated with two filter branch circuits connected to the given filter capacitor are both greater than or equal to a corresponding threshold value.

21. The power conversion system of claim 19, wherein the filter circuit includes filter capacitors connected in a Y configuration, and wherein the at least one processor is programmed to selectively identify a given filter capacitor connected between a given branch circuit and a neutral node of the filter circuit as degrading for which a power change value associated with the given branch circuit is greater than or equal to a corresponding threshold value.

* * * * *